United States Patent Office 3,669,664

Patented June 13, 1972

3,669,664

PROCESS OF STRENGTHENING PRESENSITIZED LITHOGRAPHIC PLATE WITH LACQUER EMULSION

Ronald Alfred Charles Adams, St. Mary Cray, Kent, England, assignor to Algraphy Limited, St. Pauls Cray, Kent, England No Drawing. Filed June 20, 1969, Ser. No. 835,212
Claims priority, application Great Britain, June 21, 1968, 29,820/68
Int. Cl. G03f 7/02
U.S. Cl. 96—33 2 Claims

ABSTRACT OF THE DISCLOSURE

The image on a planographic printing plate is reinforced by treating the plate with a liquid composition comprising a dispersion in a vehicle liquid of a solution of a photopolymerisable resin having unsaturated double bonds in a solvent therefor. The solution of resin may be obtained by treating an exposed plate having a photopolymerisable resin layer with a solvent to dissolve unexposed photopolymerisable resin on said plate.

This invention is concerned with a method of reinforcing the image on a planographic printing plate and also for protecting the non-image areas of the plate from becoming ink receptive.

Planographic printing plates, commonly known in the prior art as lithographic printing plates, are made by a variety of processes. A typical process comprises coating a suitable support such as a paper or a metal sheet with a layer of a water-soluble bi-chromated colloid. Exposure to light under a transparency renders the colloidal layer insoluble in water and the unexposed portion of the coating is subsequently washed away (i.e. the plate is "developed"). The resultant hardened colloid image is ink-receptive and is therefore suitable for use as a "surface" printing image. Alternatively, the image may be used as a stencil in order to produce a reversed image in the process known to the art as the "deep-etch" process. Such bichromated colloid layers are unstable, i.e. they have a short shelf life and are subject to considerable processing variation under differing conditions of humidity and temperature. Such plates therefore have to be coated immediately before use.

More recently, pre-sensitised lithographic printing plates have become commercially available in which, the light sensitive layer is much more stable, thus leading to a sufficiently long shelf life for commercial exploitation in a "factory coated" (i.e. pre-sensitised) form. A variety of different coatings are employed and the resultant printing image may take a number of different forms, for example "surface" or "Deep-etch," and may consist of the original coating, a modification of the original coating or even a completely different material such as a "deep-etch" lacquer. Examples of the light-sensitive substances used as the light-sensitive coating in pre-sensitised plates are the photopolymerisable esters of unsaturated acids, e.g. polyvinyl cinnamate.

Whilst conventionally processed pre-sensitised lithographic printing paltes may be run with some success on a printing machine, it is noted that in some cases the image on the plate may be thin, weak or of poor ink-receptivity, leading to machine difficulties during the printing of such plates and to a short image life on the plate itself. Similarly, it has been found that an initially good image may deteriorate excessively with time.

The use of an emulsified lacquer on lithographic plates for strengthening the image is known but the emulsions proposed to date are not ideally suited to this end for a variety of reasons. For instance, the poor selectivity of attraction of the lacquer or resinous phase of the emulsion to the image areas as opposed to attraction of this phase to the non-image areas of the plate. Plugging of shadow tones and scumming also are liable to occur. Furthermore, the solvent retention of many of the resins used is very high, resulting in soft or tacky deposits in the image areas. Moreover, the solubility characteristics of resins may make them unsatisfactory as image materials in view of solvents commonly encountered in the lithographic machine room.

One of the earliest resins used for imake reinforcement was asphaltum. This is a soft resin, of poor abrasion resistance and, furthermore, is soluble in such solvents as the aliphatic hydrocarbons commonly used to wash printing ink off printing plates. Unmodified epoxy and hydroxyl-containing resinous glycidyl poly-ethers of a dihydric phenol have also been proposed for use in image reinforcing emulsified lacquers. In this connection, the properties of the particular resins employed are highly important to the successful operation of the emulsion; the hard, high melting point epoxy resins being preferred to soft resins. It was found that a melamine-formaldehyde-butanol resin was not very satisfactory and that the solubility of the resin in various solvents was of importance in the formulation of the emulsion.

Emulsions in which polyvinyl chloride/acetate resins are used as resin reinforcement compositions also have been proposed. Such resins are tough and are well known to form satisfactory lithographic images when used in "deep-etch" lacquers, but suffer from the defects of limited solubility and high solvent retention resulting in difficulties in formulation and subsequent practical use of emulsified lacquers.

In British patent specification No. 967,598 there is described and claimed a class of phenolic-formaldehyde condensation resins described in British Standard 1755/1951 Sub. No. 1232. These resins are readily soluble in a variety of solvents and have low solvent retention, but they are very brittle and are readily soluble in low molecular weight aliphatic alcohols, such as ethanol and iso-propanol, even in the presence of a proposition of admixed water. They are also soluble in dilute aqueous alkali. Since under practical operating conditions of a lithographic printing machine, alcohols such as aqueous ethyl alcohol and ethylene glycol may be encountered in the damping solutions, the image areas of the printing plate would be subject to some deterioration in the event of contamination. Alkaline-starch dispersions can be used in damping solutions but with a similar adverse effect on the image.

According to the present invention, there is provided a liquid composition for reinforcing the image on a planographic printing plate, which composition comprises a dispersion in a vehicle liquid of a solution of a photopolymerisable resin having unsaturated double bonds in a solvent therefor, which solvent is immiscible or only partially miscible with said vehicle liquid. By "photopolymerisable," we mean that the double bonds will cross-link on exposure to actinic light.

The present invention also includes a process for reinforcing a lithographic image on a printing plate which process comprises treating the image on the plate with the composition of the invention. If desired, the planographic printing plate image so treated may then be further strengthened by exposure to light or heat or both.

Suitable photopolymerisable resins for use in the invention include esters of unsaturated acids, typified by the ester polyvinyl cinnamate. Polyvinyl cinnamate may be obtained by the action of cinnamoyl chloride on polyvinyl alcohol, the cinnamic groups of the ester providing the light sensitive centres. Resins of this type are described, for example, in British patent specification No. 695,197.

Many similar photopolymerisable esters of unsaturated acids and polymeric alcohols are known in which the polymeric alcohol is, for example, starch, cellulose, epoxy resins and phenoxy resins. Other photopolymerisable resins are known in which the unsaturated bonds associated with cross linking and light sensitivity may be present as an integral part of the polymeric chain. All these photopolymerisable resins may be used and usually are used in conjunction with light sensitisers which provide an increase in sensitivity to actinic radiation. These resins are characterised by good solubility in a variety of organic solvents and are generally insoluble in water and aqueous solutions.

The vehicle liquid may be water or a water-miscible solvent, either not miscible with the resin solvent, or if partially miscible with said resin solvent then the relative volumes of the two phases are adjusted to give a two phase system in which the resin solution is the dispersed phase. Preferably, the vehicle liquid is water or an aliphatic polyhydric alcohol, especially ethylene glycol, or a single phase mixture of the two.

Lithographic desensitising agents such as phosphoric acid and its salts, including hexametaphosphates; citric acid and its salts; silicic acid and its salts, including colloidal silica; gum arabic; alginates; and salts of carboxymethyl cellulose may be included in the compositions of the invention.

The desensitiser provides the emulsion with the property of preventing the resin adhering to the non-printing areas of the plate. Any materials having this desensitising property can be used, provided they are soluble in and compatible with the solvent used in the dispersing phase. If colloids such as gum arabic or carboxymethyl cellulose are used, then they may have the dual function of desensitising and thickening or stabilising the emulsion. Generally, colloids such as polyvinyl alcohol and methyl cellulose do not have a desensitising effect but can usually act as thickeners and stabilisers.

The composition of the invention may be left uncoloured, but if desired a suitable colourant may be included in the composition. The function of the colourant, if used, is to colour the image and render it more visible, hence the concentration of dye or pigment used will depend on the intensity of colour required. Suitable dyes include the so-called oil-soluble colours such as, the Waxoline dyes sold by Imperial Chemical Industries Limited. Pigments include the phthalocyanine pigments, anthraquinonoid dyes. Pigments containing proportions of resins or wetting agents to improve or facilitate dispersion may also be used subject to practical evaluation. The stability and handling properties of the composition may be improved by the addition of thickening agents, wetting agents, emulsifying agents, fungicides and/or bactericides.

Suitable organic solvents for the dispersed lacquer phase will be chosen to suit specific photopolymerisable resins. Suitable solvents include ketones such as methyl isobutyl ketone, cyclohexanone, and acetyl acetone; esters such as methyl Cellosolve acetate ("Cellosolve" is a registered trademark); amyl acetate, and methoxybutylacetate; and chlorinated hydrocarbons such as chlorobenzene and ethylene dichloride.

The concentration of resin in the dispersed lacquer phase is not critical. Low concentrations generally give emulsions which are slow in action for image reinforcement. The preferred range of concentration of resin is from about 10 to 45% by weight of the resin solution.

When the light-sensitive compound of the planographic printing plate to be treated with a composition of the invention is a photopolymerisable resin having unsaturated double bonds, the composition of the invention may be formed from the resin solution obtained on development of the plate. Accordingly, one embodiment of the present invention provides a method of reinforcing the image on such a plate which has been developed by treating the exposed plate with a solvent for the unexposed (i.e. non-polymerised resin) but not for the exposed (i.e. polymerised resin), which method comprises forming a liquid composition according to the present invention by dispersing said solution in a vehicle liquid with which said solvent is immiscible or only partially miscible and treating the developed image with said composition. If desired, the composition may be formed in situ by allowing the solution of unexposed resin to remain in contact with the developed plate and forming the dispersion by adding the vehicle liquid, and any other ingredients of the desired composition, to said solution. In this manner, an expensive material, viz the photopolymerisable resin, which otherwise would be wasted together with the developing solvent, is utilised. Further, the reinforcing composition is fully compatible with the image. Clearly the reinforcement effected by this technique is dependent upon the ratio of exposed to unexposed areas on the plate but, in the vast majority of practical cases, the exposed areas are considerably less than the unexposed areas.

Following are non-limiting examples of methods of carrying the invention into effect.

EXAMPLE 1

The lacquer (dispersed phase)

| | Parts |
|---|---|
| Kodak photosensitive lacquer | 5 |
| Microlith Blue 4 GA dye | 1 |
| Dispersed by ball milling in cyclohexanone | 0.14 |

The dispersing phase

| | Parts |
|---|---|
| Gum arabic solution SG1.170 | 100 |
| Phosphoric acid SG 1.75 | 2 |
| Dissolved in water | 80 |

Kodak photosensitive lacquer is a proprietory product of Eastman Kodak Company and contains 28% by weight of polyvinyl cinnamate in solution in a mixed solvent.

Microlith Blue 4 GA is a blue pigment provided by the Ciba Clayton Company Ltd. of Coulsdon, Surrey, England, which contains a proportion of ethyl cellulose to aid in dispersion.

The two phases were shaken together to provide an emulsion.

A pre-sensitised lithographic printing plate, known as an Algraphy Sensalith plate (see Example 5) was exposed to light through a line and half tone negative in the normal manner and developed by rubbing over with a cotton wool pad soaked in Algraphy PSP developer which is an emulsion developer of the type described in U.S. patent specification No. 3,019,106. The excess developer was then washed off and the plate was dried. A red coloured image was visible. A small quantity of well shaken lacquer emulsion of the above formulation was then poured onto the plate and wiped all over the plate with a pad of cotton wool. The image quickly assumed a bluish colour and wiping was continued until the image was no longer deepening in colour and the background appeared to be practically colourless. The excess lacquer-emulsion was wiped off and the plate then dried. The plate was then placed on a printing machine and run whereupon there was a demonstrable improvement in printing life and abrasion resistance compared with that obtained from an Algraphy Sensalith plate which had been processed in a similar manner but omitting the lacquer-emulsion reinforcement.

EXAMPLE 2

Example 1 was repeated in its entirety except that before the plate with the reinforced image was placed on the machine it was given an exposure to light from a carbon arc lamp. Such a treatment improved the life of the image to an appreciable extent over the plate of Example 1.

EXAMPLE 3

Example 1 was repeated in its entirety except that before the plate with the reinforced image was placed on the printing machine it was placed in an oven at 150° C. for ten minutes. This treatment improved the life of the image to an appreciable extent over the plate of Example 1.

EXAMPLE 4

A plate that had been reinforced and then exposed to actinic light as in Example 2 was placed in an oven at 150° C. for ten minutes. This treatment improved the life of the image to a greater extent than the treatments of Examples 2 and 3.

EXAMPLE 5

An Algraphy Sensalith pre-sensitised printing plate which comprises a grained aluminium plate having thereon a resistant oxide coating covered with a layer of a light sensitive resin of the class represented by polyvinyl cinnamate was exposed to light through a line and half tone negative in the usual manner.

A small quantity of ethylene glycol monoethyl ether acetate was poured on to the plate and the whole area of the plate was covered using a small pad of cotton wool. The plate developed in a few seconds leaving a barely visible image. Whilst the plate was still covered with a liquid film of developer, an approximately equal volume of the undermentioned composition was poured onto the plate and then distributed by means of the same pad of cotton wool in such a manner as to mix the two liquids. The image rapidly became visible and movement of the cotton pad was continued until no further intensification of colour took place. The background appeared to be almost colourless, the image a clear blue. Excess liquid was removed by wiping with clean cotton wool and the plate was dried.

The plate was then placed on a lithographic machine and the image was demonstrably more resistant to abrasion than the similar plate processed normally, the more so if the image was exposed to light or heat before being used.

The composition had the following formula:

| | Gms. |
|---|---|
| Irgalite Fast Blue MPS 2 (Geigy) | 2 |
| Cyclohexanone | 10 |
| Ethylene dichloride | 10 |
| Gum arabic solution in water SC1.12, 180 mls. | |
| Ammonium dihydrogen phosphate | 5 |
| Perminal BX | 0.25 |

The two phases were mixed separately and then shaken well together. Irgalite Fast Blue MPS 2 is a phthalocyanine pigment identified in the Colour Index as Pigment Blue 15 No. 74160 and Perminal BX is the sodium salt of alkylated naphthalene sulphonic acid and is a wetting agent marketed by Imperial Chemical Industries Limited.

I claim:

1. A process of reinforcing a lithographic image on an exposed planographic printing plate having, as the light-sensitive compound, a photopolymerizable resin with unsaturated double bonds which process comprises
   (a) developing the exposed plate with an organic solvent for the unexposed resin but not for the exposed resin constituting the image,
   (b) treating the image by allowing the resultant solution of unexposed resin dissolved in the solvent to remain in contact with the developed plate and by adding to the solution a vehicle liquid consisting of water or water miscible organic liquid with which the solvent is immiscible or only partially miscible, and
   (c) thereafter further strengthening the treated image by exposing the same to actinic light and/or by subjecting the same to heating at elevated temperature.

2. A process of reinforcing a lithographic image on an exposed and developed planographic printing plate and consisting of a photopolymerisable resin with unsaturated double bonds which have been light hardened, which process comprises treating the plate with a preformed lacquer composition comprising a dispersion in a vehicle liquid consisting of water or water miscible organic liquid, of a solution of a photopolymerisable resin having unsaturated double bonds in an organic solvent therefor, which solvent is immiscible or only partially miscible with said vehicle liquid, and thereafter further strengthening the treated image by exposing the same to actinic light and/or by subjecting the same to heating at elevated temperature.

References Cited

UNITED STATES PATENTS

| | | | |
|---|---|---|---|
| 3,238,042 | 3/1966 | Uhlig | 96—33 |
| 3,455,688 | 7/1969 | Adams et al. | 96—33 |
| 921,529 | 3/1963 | Great Britain | 96—33 |

FOREIGN PATENTS

NORMAN G. TORCHIN, Primary Examiner

W. H. LOUIE, Jr., Assistant Examiner

U.S. Cl. X.R.

96—35.1; 101—456, 463